United States Patent
Pfeuffer et al.

(10) Patent No.: US 10,191,134 B2
(45) Date of Patent: Jan. 29, 2019

(54) METHOD AND APPARATUS FOR DYNAMIC DISTORTION CORRECTION OF MAGNETIC RESONANCE IMAGE RECORDINGS

(71) Applicant: Siemens Aktiengesellschaft, Munich (DE)

(72) Inventors: Josef Pfeuffer, Kunreuth (DE); Mario Zeller, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 585 days.

(21) Appl. No.: 14/938,094

(22) Filed: Nov. 11, 2015

(65) Prior Publication Data

US 2016/0131732 A1 May 12, 2016

(30) Foreign Application Priority Data

Nov. 11, 2014 (DE) .................. 10 2014 222 964

(51) Int. Cl.
  *G01R 33/565* (2006.01)
  *G01R 33/24* (2006.01)
  *G01R 33/561* (2006.01)

(52) U.S. Cl.
  CPC ..... *G01R 33/56563* (2013.01); *G01R 33/243* (2013.01); *G01R 33/56536* (2013.01); *G01R 33/5616* (2013.01)

(58) Field of Classification Search
  CPC .......... G01R 33/5616; G01R 33/56563; G01R 33/243; G01R 33/385; G01R 33/561
  USPC ........................................................ 324/322
  See application file for complete search history.

(56) References Cited

U.S. PATENT DOCUMENTS

| | | | |
|---|---|---|---|
| 5,233,992 A * | 8/1993 | Holt ...................... | A61B 5/055 324/308 |
| 8,040,133 B2 | 10/2011 | Pfeuffer et al. | |
| 2004/0070396 A1 * | 4/2004 | DeMeester ........ | G01R 33/3873 324/309 |

(Continued)

OTHER PUBLICATIONS

Irfanoglu et al. "Susceptibility Distortion Correction for Echo Planar Images with Non-uniform B-Spline Grid Sampling: A Diffusion Tensor Image Study", Miccai 2011, G. Fichtinger et al. (Eds.): pp: 174-181; (2011).

(Continued)

*Primary Examiner* — Melissa Koval
*Assistant Examiner* — Courtney McDonnough
(74) *Attorney, Agent, or Firm* — Schiff Hardin LLP

(57) ABSTRACT

In a method and apparatus for the correction of image data dynamically acquired with a magnetic resonance imaging method, a reliable $B_0$ field map is recorded as a basic reference field map. Image data (VB) with distorted coordinates are also acquired over a predefined recording time. In addition, a set of distorted, dynamically obtained $B_0$ field maps is acquired during the recording time. Incorrect $B_0$ field maps are identified by comparison of the dynamically obtained $B_0$ field maps with the basic reference field map, and the set of distorted, dynamically obtained $B_0$ field maps is corrected accordingly. The acquired image data with distorted coordinates are corrected with the use of the corrected set of distorted, dynamically obtained $B_0$ field maps.

15 Claims, 5 Drawing Sheets

(56) References Cited

U.S. PATENT DOCUMENTS

| | | | | |
|---|---|---|---|---|
| 2009/0174403 A1* | 7/2009 | Lu | G01R 33/243 | 324/307 |
| 2009/0195247 A1* | 8/2009 | Pfeuffer | G01R 33/5616 | 324/307 |
| 2011/0254547 A1* | 10/2011 | Reeder | G01R 33/4828 | 324/309 |
| 2015/0362575 A1* | 12/2015 | Ourselin | G01R 33/56536 | 382/131 |
| 2016/0124065 A1 | 5/2016 | Pfeuffer et al. | | |

OTHER PUBLICATIONS

U.S. Appl. No. 14/932,235, filed Nov. 4, 2015, Pfeuffer et al.

Schmithorst et.al: "Simultaneous Correction of Ghost and Geometric Distortion Artifacts in Epi Using a Multi-Echo Reference Scan", IEEE Trans Med Imaging. vol. 20, No. 6, pp. 535-539, (2001).

Xiang et al: "Correction for Geometric Distortion and N/2 Ghosting in EPI by Phase Labeling for Additional Coordinate Encoding (PLACE)", Magnetic Resonance in Medicine, vol. 57, pp. 731-741, (2007).

Dagher et al.: High-Resolution, Large Dynamic Range Field Map Estimation, in: Magnetic Resonance in Medicine vol. 71, pp. 105-117; (2014).

Man et.al.: "Multifrequency Interpolation for Fast Off-resonance Correction",: Magnetic Resonance in Medicine, vol. 37, pp. 785-792, (1997).

Zeller et. al.; "Respiration Impacts Phase Difference-Based Field Maps in Echo Planar Imaging"; Magnetic Resonance in Medicine vol. 72, pp. 446-451 (2014).

Zeller et.al.: "Phase-Labeled Reference EPI for Frequency-Segmented Inhomogeneity Corrections (PREFICS)",: Magnetic Resonance in Medicine, pp. 1-6, (2013).

Jezzard et al: "Correction for Geometric Distortion in Echo Planar Images from Bo Field Variations", Magnetic Resonance in Medicine, vol. 34, pp. 65-73, (1995).

* cited by examiner

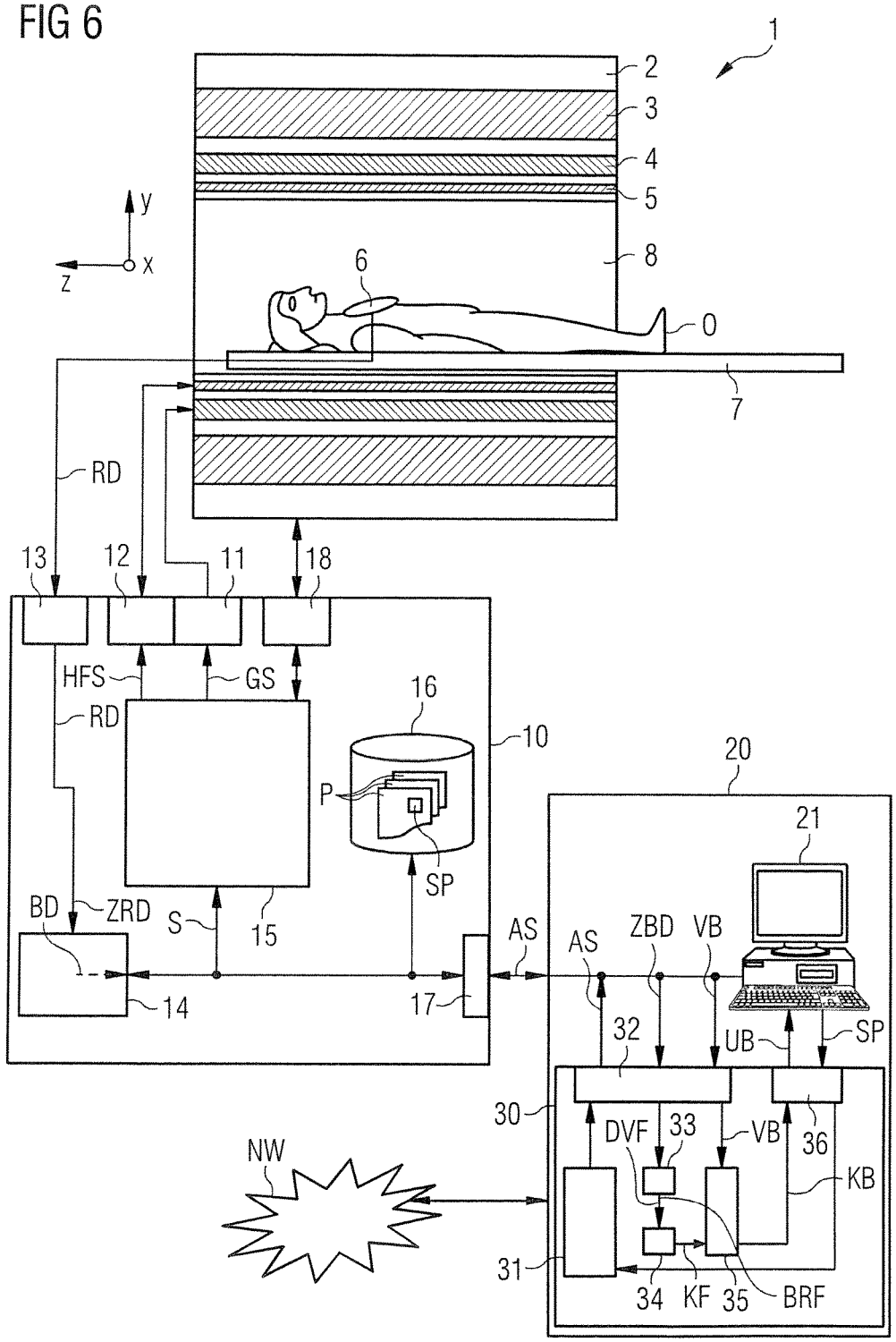

METHOD AND APPARATUS FOR DYNAMIC DISTORTION CORRECTION OF MAGNETIC RESONANCE IMAGE RECORDINGS

BACKGROUND OF THE INVENTION

Field of the Invention

The invention concerns a method for the correction of image data dynamically acquired with a magnetic resonance imaging method. The invention also relates to an image correcting device for a magnetic resonance scan. The invention also relates to a magnetic resonance system.

The invention makes reference to co-pending U.S. application Ser. No. 14/932,235, filed Nov. 4, 2014, corresponding to German patent application no. 102014222495.0. The content of the co-pending United States application is incorporated herein by reference.

Description of the Prior Art and Related Subject Matter

In what is known as Echo Planar Imaging (EPI) a number of phase-encoded echoes is used to fill a slice in k-space, also called a raw data matrix. The basic idea of this technique is to generate a series of echoes in readout gradients, after an individual (selective) RF excitation, which is allocated by a suitable modulation of the phase-encoding gradient to different lines in k-space plane. In this way, for example, a whole slice can be detected with a single RF excitation.

Due to the long echo train, particularly in the case of echo planar imaging additional geometric distortions, such as elongations or compressions, occur in the image. These will be called distortions below.

As described in detail in the aforementioned co-pending application Ser. No. 14/932,235, these artifacts can be eliminated inter alia by retrospective methods. These intervene in the reconstruction process only after recording of the raw data. With this type of post-processing method a separate field map, also called a $B_0$ field map, is conventionally recorded which may be present either in undistorted coordinates or in distorted coordinates.

$B_0$ field maps indicate the spatial distribution of what are known as off-resonance frequencies. Off-resonance frequencies should be taken to mean frequency shifts of the scan signals which occur due to the susceptibility jumps and external magnetic field inhomogeneities.

As described in detail in co-pending application Ser. No. 14/932,235, there exist both various types of $B_0$ field maps (distorted and undistorted) and a wide variety of correction algorithms. These algorithms are each fixed to a one type of $B_0$ field map. Since both field map types and the correction algorithms have different advantages and disadvantages, a flexible combination of any field maps with any algorithms is desirable. One possibility of converting field maps into each other is described in detail in co-pending application Ser. No. 14/932,235.

Due to external influences, heating of the system or patient movement the actual field distribution with respect to the original distribution detected in a field map can change with time. It is precisely with relatively long recording periods that dynamic updating of the field maps is therefore desirable, so that the geometric distortion correction does not lead to incorrect results.

A dynamic correction with the use of distorted field maps can be implemented in that one up-to-date field map respectively is created during the course of a continuous EPI recording from two repeated slice recordings respectively with the aid of the PLACE method. Since the image phase in the two slice recordings is affected differently by said dynamic influences, for example breathing, and the PLACE method is based on the phase difference between the two recordings, inaccuracies can occur during recording of the updated $B_0$ field maps.

If undistorted $B_0$ field maps are acquired on the basis of gradient echo recordings, admittedly these inaccuracies do not occur, but gradient echo recordings are not suitable for integration in a continuous image recording since they require a great deal of time. For this reason undistorted field maps are only carried out as a pre-scan, but are not suitable for carrying out an update during the image recording.

SUMMARY OF THE INVENTION

An object of the present invention is to develop a dynamic image recording method having an improved quality of image reproduction and a correction of the distortions that is adjusted to dynamic changes.

A basis of the inventive method is to combine a reliable $B_0$ field map obtained from a pre-scan with dynamically obtained $B_0$ field map recordings during the distortion correction of continuous recordings.

The $B_0$ field map obtained in the pre-scan is used as a reference for the detection of $B_0$ field maps that are incorrectly calculated due to disruptions, such as breathing movements. Therefore, with the use of a comparison between one or more dynamically obtained field map recording(s) and the reliable field map obtained in the pre-scan, field maps, falsified by disruptions, of a series of field maps created over the recording time can be ascertained and eliminated.

In the inventive method for correction of image data dynamically acquired with a magnetic resonance imaging method firstly a reliable $B_0$ field map is recorded in advance as a basic reference field map. A reliable field map means a field map which does not have any inaccuracies that are typical of dynamic recordings. A reliable recording of a field map can occur, for example, as a static recording, such as with the use of a gradient echo sequence with two recordings and subsequent phase subtraction. Image data with distorted coordinates are then recorded over a predefined recording time. This can be achieved with a fast recording method, such as an EPI sequence. A set of distorted, dynamically obtained $B_0$ field maps is preferably recorded during recording of the image data. This can be achieved, for example, by using data acquired during recording of the image data to create the distorted, dynamically obtained $B_0$ field maps, so that no additional time has to be expended for recording the distorted, dynamically obtained $B_0$ field maps. With the aid of the basic reference field map incorrect $B_0$ field maps are identified by comparison of the dynamically obtained $B_0$ field maps with the basic reference field map. The set of distorted, dynamically obtained $B_0$ field maps is then corrected. Finally, retrospective correction of the acquired image data with distorted coordinates occurs with the aid of the corrected set of distorted, dynamically obtained $B_0$ field maps.

The inventive image correcting device for a magnetic resonance scan has a control sequence-generating computer that is designed (configured) to generate a control sequence having a first partial sequence to generate preferably undistorted reliable magnetic resonance raw data from a region of an examination object for a basic reference field map, and having a second partial sequence for dynamic generation of distorted magnetic resonance raw data from a region of an examination object during an actual image recording over a period of time. The period of time forms the recording time in which the actual dynamic magnetic resonance image recording occurs. In this context distorted magnetic resonance raw data should be taken to mean raw data whose corresponding image data, which results from the transformation of the raw data from k-space into the image domain, is distorted. The inventive image correcting device also has an image reconstruction computer that is designed to ascertain image data on the basis of the acquired magnetic resonance raw data, and a field map-generating unit which is adapted to create a basic reference field map, preferably an undistorted $B_0$ field map, on the basis of the ascertained reliable image data and to create a set of dynamically obtained distorted $B_0$ field maps on the basis of the distorted image data. The inventive image correcting device also has a field map correction computer that is configured to identify and correct incorrect $B_0$ field maps by comparison of the dynamically obtained $B_0$ field maps with the basic reference field map, and an image correction computer, which is adapted to correct the dynamically acquired, distorted image data on the basis of the set of distorted, dynamically obtained $B_0$ field maps.

The inventive magnetic resonance system includes the inventive image correcting device. The inventive image correcting device is therefore in particular part of a magnetic resonance system. It can be part of an existing control computer, reconstruction computer or evaluation computer.

The (aforementioned and optionally further) computers do not necessarily have to be designed as hardware components. Instead they may also be implemented as software modules, for example if the described functions can be carried out by another component, such as a central process unit or an existing control unit, already implemented on the same device. The computers can likewise be composed of hardware and software components, such as a standard hardware unit which is specifically configured by software for the specific intended purpose. A number of computers may be combined to form a joint computer.

The invention therefore also encompasses a non-transitory, computer-readable data storage medium that can be loaded directly into a processor of the magnetic resonance system, having program code to execute all steps of the inventive method (also according to the aspects further below) when the program code is executed by the processor of a magnetic resonance system.

The reliable $B_0$ field map is preferably an undistorted field map or a statically recorded distorted field map or a field map which is based on an averaging of a number of dynamically recorded distorted field maps.

To be able to compare an undistorted basic reference field map with the set of distorted, dynamically obtained $B_0$ field maps, there is preferably a conversion of one of the field map types into another. In other words, there is preferably a conversion of the undistorted basic reference field map into a distorted basic reference field map before the comparison step.

Alternatively a conversion of the recorded distorted, dynamically obtained $B_0$ field maps into undistorted, dynamically obtained $B_0$ field maps may also be carried out.

In an embodiment of the inventive method the option as described in application 102014222495.0 is used, namely, performing field map conversions in both directions, i.e. from a distorted $B_0$ field map into an undistorted $B_0$ field map, and vice versa, from an undistorted field map into a distorted $B_0$ field map. Advantages of the various types of field map may be combined with each other by way of the described field map conversion. Field maps recorded with the use of the gradient echo method are particularly suitable as reliable basic reference field maps. EPI sequences, however, are much more suitable for dynamic recordings. Updating of $B_0$ field maps during dynamic image recording is likewise expediently performed with the use of the dynamically recorded data, although this produces only distorted $B_0$ field maps. To be able to perform a consistency check between the basic reference field map and the updated $B_0$ field maps it is particularly advantageous to convert $B_0$ field maps of the one type into another type. Errors in the recording of the dynamically recorded $B_0$ field maps can be detected and quantified better in this way.

In another embodiment of the inventive method, the comparison of the dynamically obtained $B_0$ field maps with the basic reference field map occurs pixel-by-pixel or slice-by-slice, or as a combination of all pixels, preferably as the total of all pixels or differentiated according to body region or tissue in relation to the standard deviation or the mean or the difference.

In this connection, it may be ascertained whether the mean over all pixels of a slice or over all pixels of the total volume or over all pixels of certain tissue between the two field maps is similar, i.e. whether the difference in the means is sufficiently low.

Alternatively or additionally, it may be ascertained in a comparison whether the standard deviation over all pixels of a slice or over all pixels of the total volume or over all pixels of certain tissue between the two field maps has similar values.

The patient may have turned between the recordings of the different field maps, i.e. the pixels are now at a different location, but mean and standard deviation should nevertheless be similar.

Alternatively or additionally, it may be checked whether the pixel-by-pixel difference between two $B_0$ field maps is low on average. In this case the patient must not move too much. In return possible local deviations are better detected.

More complex comparison methods, e.g. histogram comparisons, are also conceivable.

An excessive deviation is preferably ascertained with the aid of a fixed or dynamic threshold value and excessively deviant, distorted, dynamically obtained $B_0$ field maps are corrected or are discarded and replaced by a replacement field map.

In one variant of the inventive method excessively deviant, distorted, dynamically obtained $B_0$ field maps are corrected by subtraction of a global offset relating to the basic reference field map or an offset relating to an updated reference field map obtained from the set of distorted, dynamically obtained $B_0$ field maps. In this case the values plotted in the $B_0$ field maps are therefore corrected by the same offset value.

The replacement field map replacing the discarded $B_0$ field map can comprise for example the basic reference field map or an updated reference field map obtained from the set of distorted, dynamically obtained $B_0$ field maps or a combination of part of the set of distorted, dynamically obtained $B_0$ field maps, preferably a weighted total of part of the set of distorted, dynamically obtained $B_0$ field maps.

In another embodiment of the inventive method, one of the dynamically obtained $B_0$ field maps or a combination of dynamically obtained $B_0$ field maps, preferably a weighted total of dynamically obtained $B_0$ field maps, are used as the reference field map instead of the basic reference field map.

In a particularly efficient variant of the inventive method, the basic reference field map is recorded with a reduced spatial resolution and adjusted to the resolution of the image data with the aid of an interpolation method. Following a comparison with distorted, dynamically obtained $B_0$ field maps the basic reference field map is then replaced by one of these or by a combination, preferably a weighted total of a plurality of these.

In an alternative embodiment of the inventive method, the basic reference field map is recorded with a high spatial resolution and updated with the aid of low-resolution distorted, dynamically obtained $B_0$ field maps.

In a variant of the inventive method, a bilinear interpolation or a k-space-based conjugate phase method is carried out in the conversion step.

During the correction step the acquired image data, which was recorded with distorted coordinates, is corrected in one variant of the inventive method with the use of a bilinear interpolation.

As noted above, it is preferred that a gradient echo method is used as the image recording method to record the reliable, preferably undistorted $B_0$ field map. The gradient echo method can be a double-echo or multi-gradient echo recording method.

In an alternative embodiment of the inventive method the reliable $B_0$ field map is recorded during the course of an adjustment process that occurs before recording of the distorted image data.

An image recording method with an EPI sequence is preferably used to acquire the image data with distorted coordinates.

In one embodiment of the invention the inventive image correcting device comprises a field map conversion unit which is adapted to convert the undistorted basic reference field map into a distorted field map. The field map conversion enables the direct comparison of the undistorted basic field maps with the dynamically recorded distorted field maps.

BRIEF DESCRIPTION OF THE DRAWINGS

FIG. 6 schematically illustrates a magnetic resonance apparatus according to an exemplary embodiment of the invention.

DESCRIPTION OF THE PREFERRED EMBODIMENTS

Figure 1:
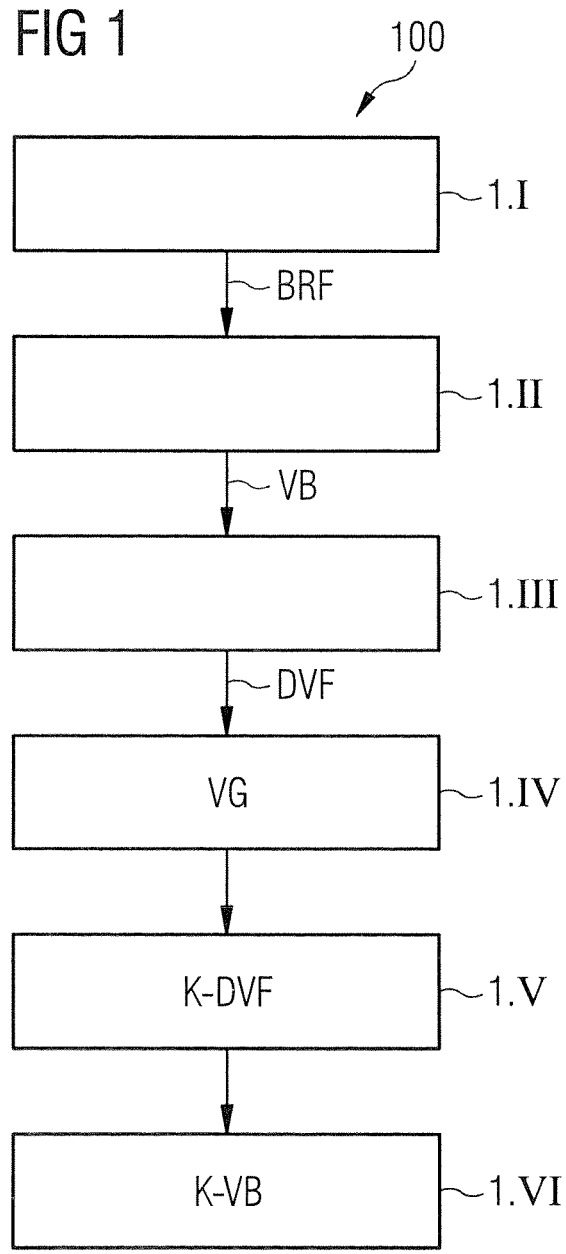
FIG. 1 is a flowchart of the method for dynamic magnetic resonance image recording according to an exemplary embodiment of the invention.

FIG. 1 is a flowchart that illustrates the method 100 for dynamic magnetic resonance image recording according to one exemplary embodiment of the invention. In step 1.I a reliable $B_0$ field map is generated as a basic reference field map BRF. The reliable reference map can be, for example, an undistorted $B_0$ field map created with the use of a gradient echo recording method. In step 1.II image data VB with distorted coordinates is acquired over a predefined recording time. The distorted image data can be recorded in a time-saving manner for example by means of an EPI method. In step 1.III a set of distorted, dynamically obtained $B_0$ field maps DVF is acquired during the recording time. In other words, the recording of the distorted, dynamically obtained $B_0$ field maps DVF is combined with the recording of the distorted image data. In particular the data obtained for recording the distorted image data VB can advantageously also be used to generate the distorted, dynamically obtained $B_0$ field maps DVF. In other words, the data acquired in step 1.II during image recording can be used as the basis for the dynamically obtained $B_0$ field maps DVF, so that no additional recordings have to be carried out for them. The described steps 1.I to 1.III shall also be called an acquisition phase below, in which the acquisition of raw data and the generation of the field maps BRF, DVF and image data VB occurs. This acquisition phase is shown in detail in FIG. 2.

In a correction phase, which occurs retrospectively, incorrect $B_0$ field maps DVF are identified in step 1.IV by comparison of the dynamically obtained $B_0$ field maps DVF with the basic reference field map BRF. If, for example, the basic reference field map is an undistorted $B_0$ field map, it is expedient to convert the undistorted basic reference field map into a distorted $B_0$ field map before the comparison VG with the dynamically obtained $B_0$ field maps DVF for the purpose of better comparability. This conversion is illustrated in detail in FIG. 3. In step 1.V the set of distorted, dynamically obtained $B_0$ field maps DVF is then corrected, and this is denoted in FIG. 1 by K-DVF. In step 1.VI the image data VB acquired with distorted coordinates is finally corrected with the aid of the corrected set of distorted, dynamically obtained $B_0$ field maps. The correction K-VB of a distorted image recording with the aid of a distorted $B_0$ field map is shown in detail in FIG. 4.

Figure 2:
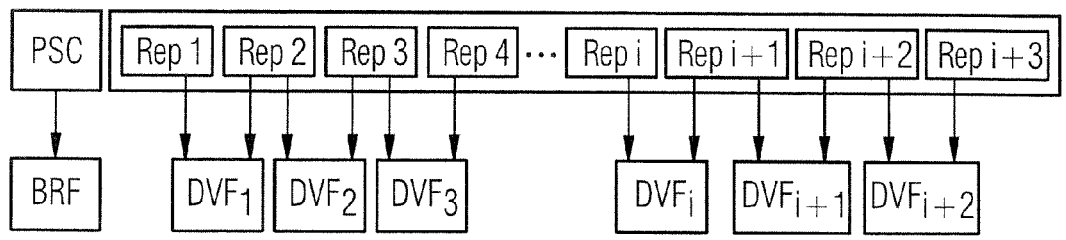
FIG. 2 schematically illustrates the acquisition phase of a method according to an exemplary embodiment of the invention.

FIG. 2 outlines the acquisition phase of a method for dynamic magnetic resonance image recording according to one exemplary embodiment of the invention. During the course of the acquisition phase a recording PSC of a region that is to be imaged subsequently is firstly created in advance in accordance with step 1.I in FIG. 1. This recording is used to generate a basic reference field map BRF. For example, to generate the basic reference field map BRF, a plurality of recordings are created with a gradient echo sequence and a phase subtraction performed. The actual dynamic recording of the moving region that is to be imaged then occurs in accordance with steps 1.II and 1.III. Dynamically obtained $B_0$ field maps DVF are generated from successive image recordings $Rep_1 \ldots Rep_{i+3}$, with these image acquisitions differing in an alternating manner or some other periodic way in respect of phase information, phase encoding direction or in respect of the echo time, and one $B_0$ field map DVF respectively being calculated on the basis of this difference from pairs of immediately successive image acquisitions. The procedure when ascertaining the dynamically obtained $B_0$ field maps is described in detail in patent application DE 10 2008 007 048 B4.

Figure 3:
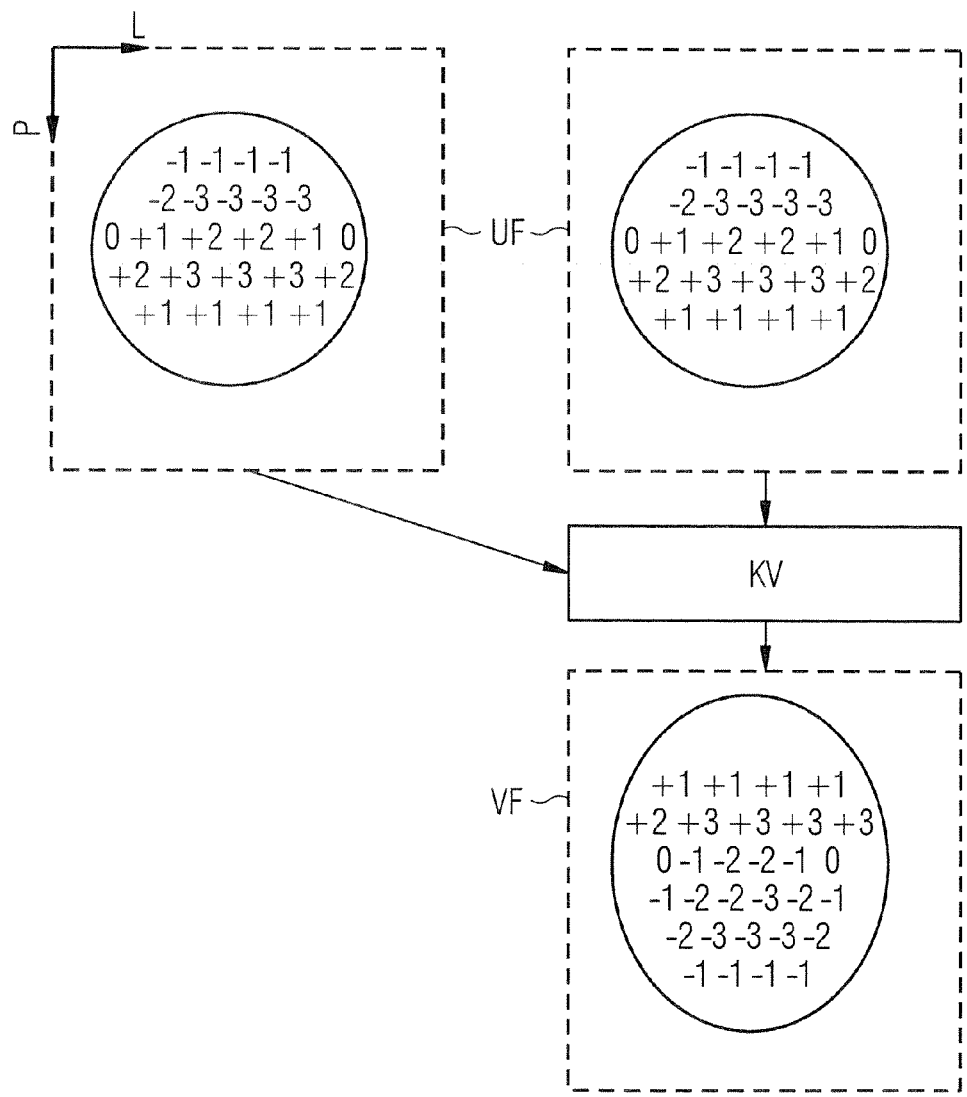
FIG. 3 illustrates the conversion of an undistorted $B_0$ field map into a distorted $B_0$ field map.
Figure 4:
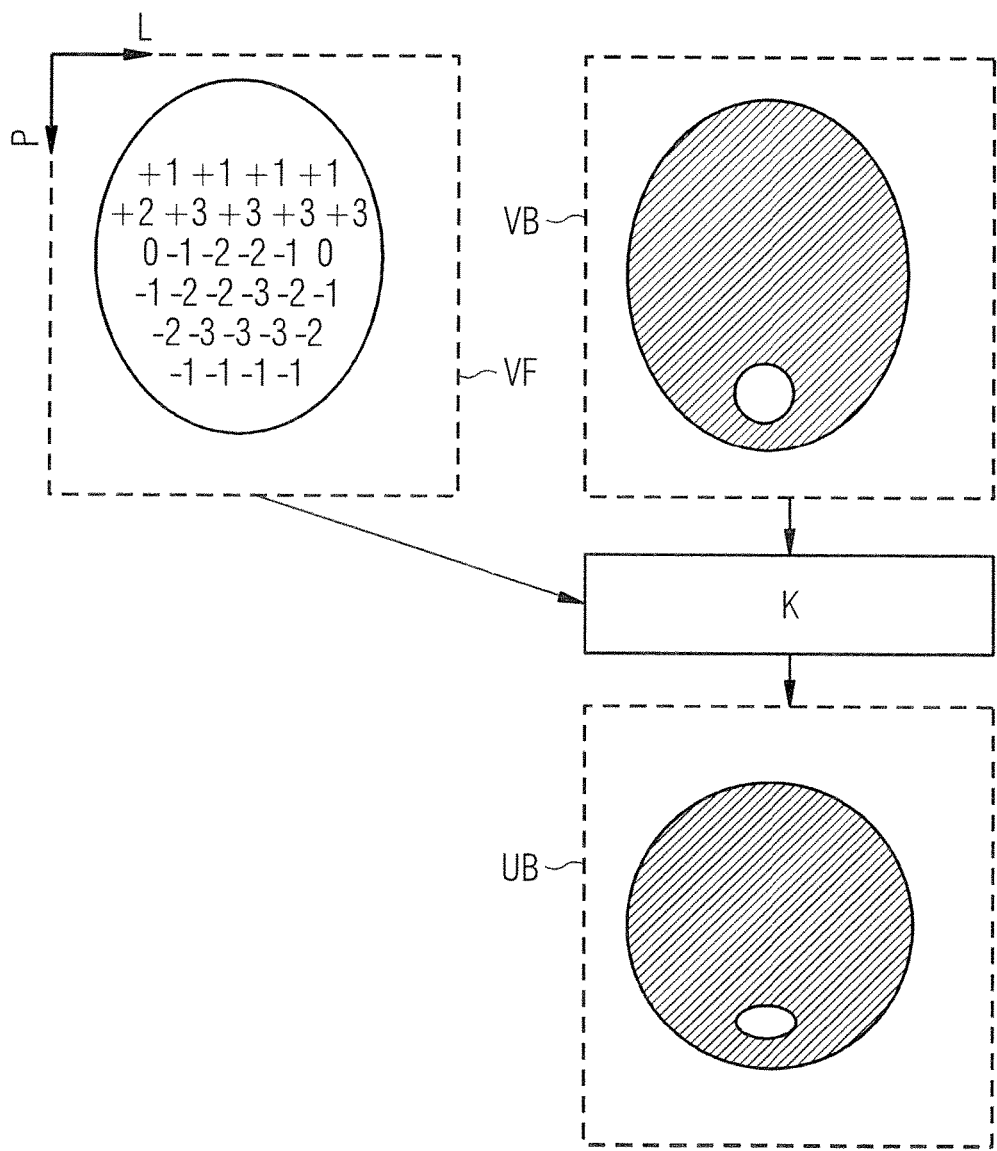
FIG. 4 illustrates the correction of a distorted image recording with the aid of a distorted $B_0$ field map.

FIG. 3 shows a method for the conversion of an undistorted $B_0$ field map UF into a distorted $B_0$ field map VF, as a part of a method for the correction of image data acquired with a magnetic resonance imaging method according to an exemplary embodiment of the invention. The top right and top left of FIG. 4 show the same undistorted $B_0$ field map UF which is symbolized by a circle. The ordinate denoted by P corresponds to the phase encoding direction of the imaging method applied during creation of the undistorted $B_0$ field map, and the abscissa denoted by L corresponds to the readout direction of the imaging method applied during creation of the undistorted $B_0$ field map. The numbers plotted on the map indicate a shift at a specific position in pixels by the given value. Bottom right shows a distorted $B_0$ field map VF which is symbolized as an ellipse. The undistorted $B_0$ field map UF is converted into a distorted $B_0$ field map VF by application to itself. A bilinear interpolation on the basis of the undistorted $B_0$ field map UF, for example, can be used as the conversion method KV.

FIG. 4 shows the geometric correction of a distorted image VB of a circle acquired with an EPI sequence with the aid of a distorted $B_0$ field map VF. The distorted $B_0$ field map VF can be recorded for example with the aid of the PLACE method. The ordinate denoted by P corresponds to the phase encoding direction of the imaging method applied during creation of the distorted $B_0$ field map and the abscissa denoted by L corresponds to the readout direction of the imaging method applied during creation of the distorted $B_0$ field map. A distorted $B_0$ field map VF is symbolized top left with the aid of an ellipse. The numerical values contained in the ellipse correspond to shift values of the pixels arranged in the distorted $B_0$ field map VF which have been shifted due to field inhomogeneities. A distorted depiction VB of a recorded image of a circle is shown top right in FIG. 4 as an ellipse. The corrected recorded image UB is shown bottom right as a circle. The correction of the distorted image VB top right with the aid of the distorted $B_0$ field map VF top left can be carried for example with a correction method K which comprises bilinear interpolation.

Figure 5:
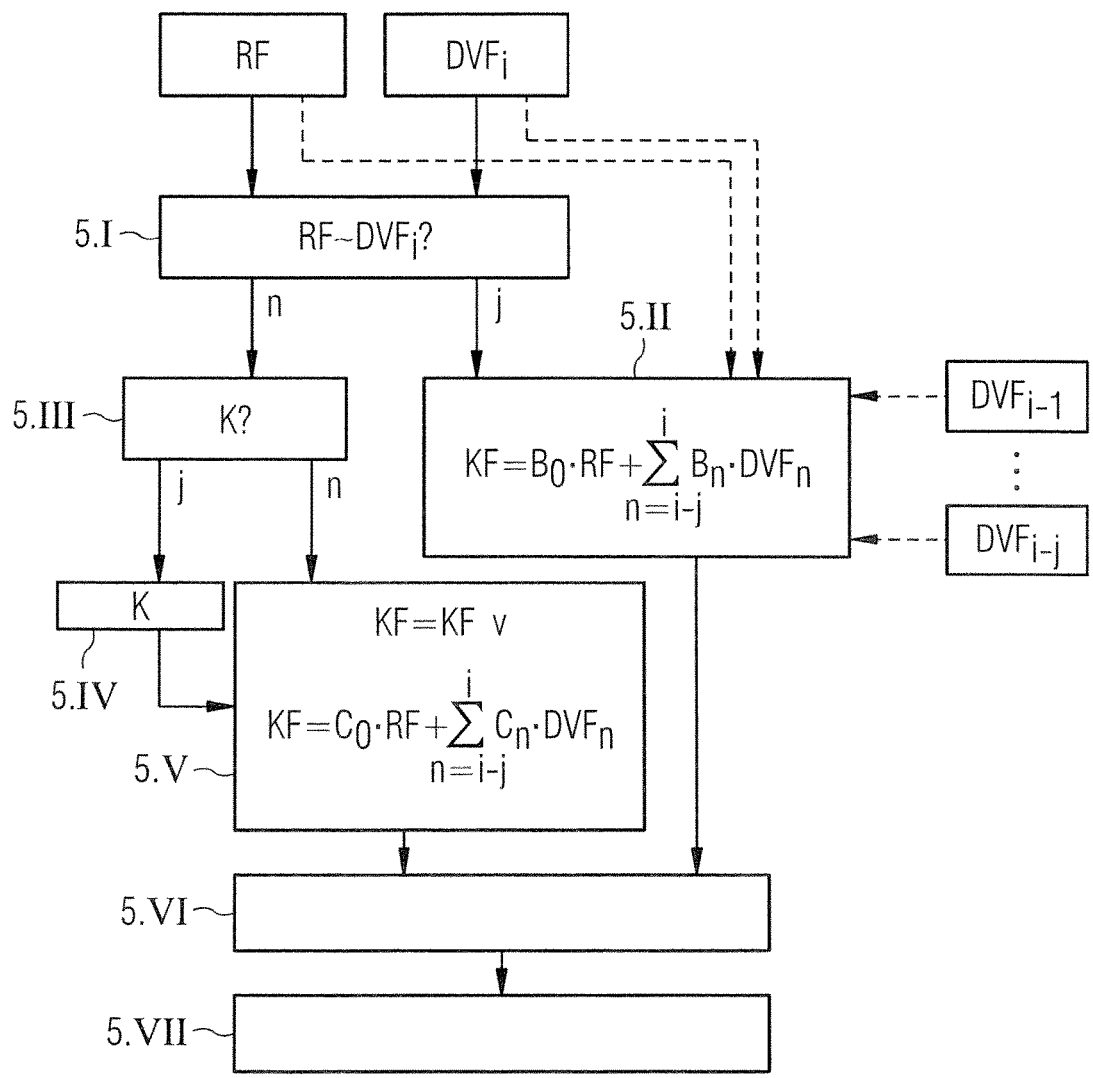
FIG. 5 schematically illustrates the course of the correction phase of a method according to one exemplary embodiment of the invention.

FIG. 5 shows the course of the correction phase of a method according to one exemplary embodiment of the invention with the aid of a flowchart. During step 5.I a comparison between a reference field map RF, which can be for example a basic reference field map BRF, and an up-to-date, dynamically obtained $B_0$ field map $DVF_i$ is carried out. If the two $B_0$ field maps are ascertained as being consistent, and this is denoted in FIG. 5 by "j", a new correction field map KF, with which the dynamically recorded image series VB is subsequently corrected, is therefore ascertained in step 5.II. This can take place according to the following formula:

$$KF = B_0 \cdot RF + \sum_{n=i-j}^{i} B_n \cdot DVF_n \quad (1)$$

Here j is ε [1,i-1] and $B_i$ are weights with which the individual $B_0$ field maps RF, $DVF_n$ enter the recalculation of the correction field map KF. The $B_0$ field maps $DVF_{i-j} \ldots DVF_{i-1}$ are dynamically created, distorted $B_0$ field maps which were generated before the up-to-date, dynamically created, distorted $B_0$ field map. Due to the consistency of the $B_0$ field map $DVF_i$ this is weighted more accordingly. $B_i$ is therefore greater than the other weights $B_1$ to $B_{i-1}$. If the up-to-date, dynamically obtained $B_0$ field map $DVF_i$ is not consistent with the reference field map RF, and this is denoted in FIG. 5 by "n", it is ascertained in step 5.III whether the up-to-date, dynamically obtained $B_0$ field map $DVF_i$ should be corrected, and this is symbolized in FIG. 5 by "K?". The decision as to whether the up-to-date, dynamically obtained $B_0$ field map $DVF_i$ should be corrected can be made for example depending on certain threshold values. If the up-to-date, dynamically obtained $B_0$ field map $DVF_i$ differs from the reference field map by more than a fixed threshold value, and this is denoted in FIG. 5 by "j", a correction K of the up-to-date, dynamically obtained $B_0$ field map $DVF_i$ occurs in step 5.IV with the aid of the reference field map RF. If the threshold value is not exceeded, and this is denoted in FIG. 5 by "n", then the method passes directly to step 5.V, in which the previous correction field map KF is retained, or a recalculation of the correction field map KF is performed as a weighted total with the reference field map RF and more weakly weighted field map $DVF_i$ and the field maps i-j to i-1.

This can take place according to the following formula:

$$KF = C_0 \cdot RF + \sum_{n=i-j}^{i} C_n \cdot DF_n \quad (1)$$

Here j is ε [1,i-1] and $C_n$ are weights with which the individual field maps enter the recalculation of the correction field card KF. In step 5.VI the correction method is applied to the image series VB with the new correction field map KF analogously to step 1.VI.

In optional step 5.VII a new reference field map RF is calculated by taking into account the new correction field map KF. This can be expedient if the up-to-date $B_0$ field map deviates too much from the basic reference field map.

FIG. 6 shows a magnetic resonance apparatus 1 according to an exemplary embodiment of the invention. The apparatus 1 includes the magnetic resonance scanner 2, which has an examination space 8 or patient tunnel located therein. A couch 7 can be moved into this patient tunnel 8, so that a patient O or test person lying thereon during an examination can be positioned at a specific position inside the magnetic resonance scanner 2 relative to the magnetic system and radio-frequency system arranged therein, or may also be moved between different positions during a scan.

The components of the magnetic resonance scanner 2 include a basic field magnet 3, a gradient system 4 having magnetic field gradient coils for generating magnetic field gradients in the x, y and z directions, and a whole body radio-frequency coil 5. The magnetic field gradient coils in the x, y and z directions (scanner coordinate system) can be controlled independently of each other, so that by a predefined combination, gradients can be applied in any logical spatial directions, for example in a slice selection direction, in a phase encoding direction or in a readout direction which are not necessarily parallel to the axes of the room coordinate system. The magnetic resonance signals induced in the examination object O can be received by the body coil 5 with which, usually, the radio-frequency signals for inducing the magnetic resonance signals are also emitted. However these signals are conventionally received by a local coil arrangement 6 having local coils (of which only one is shown here) for example on or under the patient O. All of these components are basically known to those skilled in the art and therefore are shown only schematically in FIG. 6.

The components of the magnetic resonance scanner 2 can be controlled by a controller 10. This may be a control computer which can have a large number of individual computers—optionally also spatially separate and connected together by suitable cables or the like. This controller 10 is connected by a terminal interface 17 to a terminal 20, via which an operator can control the whole system 1. In the present case this terminal 20 has a computer 21 with keyboard, one or more screens and further input devices, such as a mouse or the like, or is designed as a computer 21 of this kind, so that the operator has a graphic user interface at his disposal.

The controller 10 has inter alia a gradient control unit 11 which can in turn have multiple sub-components. The individual gradient coils are wired according to a gradient pulse sequence GS to control signals by this gradient control unit 11. As described above, these are gradient pulses which are set during a scan at precisely provided temporal positions and with a precisely predefined course over time.

Furthermore, the controller 10 has a radio-frequency transmitting unit 12 to feed radio-frequency pulses respectively according to a predefined radio-frequency pulse sequence RFS of the control sequence AS into the whole body radio-frequency coil 5. The radio-frequency pulse sequence RFS include the selective excitation pulses mentioned above. The magnetic resonance signals are then received with the local coil arrangement 6, and the raw data RD received thereby are read and processed by an RF receiving unit 13. After demodulation and digitization into digital form the magnetic resonance signals are passed as raw data RD to a reconstruction unit 14, which reconstructs the image data BD therefrom as a data file, which is stored in a memory 16 and/or passed via the interface 17 to the terminal 20, so that the operator can view it. The image data BD can also be stored and/or displayed and evaluated at other locations via a network NW. Alternatively, a radio-frequency pulse sequence can be emitted by the local coil arrangement and/or the magnetic resonance signals can be received by the whole body radio-frequency coil (not shown).

Control commands to other components of the magnetic resonance scanner 2, such as the couch 7 or the main field magnet 3, are transmitted, or scan values or other information accepted, by a further interface 18.

The gradient control unit 11, RF-transmitting unit 12 and RF receiving unit 13 are each controlled in a coordinated manner by a scan control unit 15. By appropriate commands, this ensures that the desired gradient pulse sequence GS and radio-frequency pulse sequence RFS are emitted to the control sequence AS. In addition it must be ensured that at an appropriate time the magnetic resonance signals at the local coils of local coil arrangement 6 are read and processed further by the RF receiving unit 13, i.e. readout windows must be set by, for example, switching the ADCs of the RF receiving unit 13 to receive. The scan control 15 also controls the interface 18.

The underlying course of a magnetic resonance scan of this kind and said components for control are known to those skilled in the art, and thus need not be discussed in more detail herein. Furthermore, a magnetic resonance scanner 1 of this kind and the associated controller 10 can still have a large number of further components, which are likewise not described herein in detail. The magnetic resonance scanner 2 can have a different construction, for example with a patient space that is open at the side, or can be designed as a smaller scanner in which only one body part can be positioned.

To start a scan, an operator can conventionally choose, via the terminal 20, a control protocol PR provided for this scan from a memory 16 in which a large number of control protocols PR are stored for different scans. This control protocol PR includes inter alia various control parameter values SP for the respective scan. These control parameter values SP include for example the sequence type, the target magnetizations for the individual radio-frequency pulses, echo times, repetition times, the various selection directions, etc.

Furthermore, instead of from the memory 16, the operator can also retrieve control protocols from a manufacturer of the magnetic resonance system, with corresponding control parameter values SP via a network NW and then use these as described below.

All of these control parameter values SP are made available to an image correcting device 30 inter alia by a first interface 36, so that this generates an appropriate control sequence or a sequence of sub-sequences according to the inventive method. The image correcting device 30 has for this purpose a control sequence-generating unit 31 which generates a control sequence AS. The control sequence AS has a first partial sequence for generating reliable magnetic resonance raw data ZRD from a region of an examination object O for a basic reference field map BRF. The first partial sequence can be, for example, a gradient echo sequence for generating an undistorted $B_0$ field map. The control sequence AS includes, moreover, a second partial sequence for the dynamic generation of distorted magnetic resonance raw data VRD from a region of an examination object O during an actual image recording in a recording period. The second partial sequence can be, for example, an EPI sequence.

Based on the control parameter values SP a control sequence AS is ascertained by the image correcting device 30, according to which sequence the remaining components are finally controlled by the scan control unit 15. In accordance with the generated control sequence AS firstly an undistorted $B_0$ field map of a section of the body of the patient is detected, for example with the aid of a gradient echo sequence. The reliable raw data ZRD generated in the process is reconstructed with the aid of a reconstruction unit 14 to form reliable image data ZBD and is passed by a second interface unit 32 of the image correcting device 30 to a field map-generating unit 33. The field map-generating unit 33 is adapted to create a basic reference field map BRF on the basis of the reliable, preferably undistorted image data ZBD generated with the gradient echo method. The actual image recording with distorted image data VB is also carried out with the aid of the second partial sequence. This distorted image data is used by the field map-generating unit 33 to generate a set of dynamically obtained distorted $B_0$ field maps DVF. A field map correction unit 34 identifies incorrect field maps DVF by comparison of the dynamically obtained $B_0$ field maps DVF with the basic reference field map BRF and corrects the incorrect $B_0$ field maps DVF. The corrected $B_0$ field maps KF are passed to an image correction unit 35. The image correction unit 35 then carries out a correction of the distorted image data VB with the aid of the corrected $B_0$ field maps KF. The PLACE method for example is used in this connection. The corrected image data KB is then passed by the first interface 36 of the image correcting device 30 to the computer 21 and processed further by it, and for example displayed.

The entire image correcting device 30 and its components can be implemented for example in the form of software, with which the inventive method can be carried out, on one or more suitable processor(s).

It is again noted that the above-described, detailed methods and devices are exemplary embodiments and that the basic principle can also be varied by those skilled in the art without departing from the scope of the invention. Instead of in the terminal, the image correcting device 30 for example could therefore be implemented as part of the controller 10 or on the computer 21 or on a separate computing system which is connected for example by the network NW to the magnetic resonance system 1. The directions in the space may also be arbitrary, i.e. the x and y directions could for example be reversed. For the sake of completeness reference is also made to the fact that the use of the indefinite "a" or "an" does preclude the relevant features from also being present several times. Similarly, the term "unit" does not preclude this from comprising a plurality of components which can optionally also be spatially distributed.

We claim as our invention:

1. A method for correcting dynamically acquired magnetic resonance (MR) image data, comprising:

in a computer generating control signals and providing said control signals from said computer to an MR scanner comprising a basic ($B_0$) field magnet that generates a $B_0$ field, in order to operate the MR scanner so as to obtain a $B_0$ field map as a basic reference field map;

in said computer, generating further control signals and providing said further control signals from said computer to said MR scanner, after obtaining said basic reference field map, in order to operate the MR scanner so as to acquire MR data, during a predetermined MR data acquisition time, from a subject situated in the MR scanner, said MR data having distorted coordinates due to said $B_0$ field changing during said predetermined MR data acquisition time;

in said computer, using the acquired MR data to dynamically a set of distorted $B_0$ field maps during said MR data acquisition time;

in said computer, during said predetermined MR data acquisition time, comparing each of the distorted, dynamically obtained $B_0$ field maps to said basic reference field map dependent on a comparison criterion, and identifying any distorted, dynamically obtained $B_0$ field map that does not satisfy said comparison criterion as an incorrect $B_0$ field map;

in said processor, correcting each incorrect $B_0$ field map, to obtain a set of corrected distorted, dynamically obtained $B_0$ field maps; and correcting said MR data acquired from said subject in said processor using said set of corrected distorted, dynamically obtained $B_0$ field maps, and using the corrected MR data from the subject to reconstruct image data that are free of artifacts to said distorted coordinates, and display said image data at a display screen as in MR image of the subject.

2. A method as claimed in claim 1 comprising producing said $B_0$ field map used as said basic reference field map from the group consisting of an undistorted $B_0$ field map, a statically recorded distorted $B_0$ field map, and $B_0$ field map based on an averaging of a plurality of dynamically acquired distorted $B_0$ field maps.

3. A method as claimed in claim 1 comprising, before comparing said dynamically obtained $B_0$ field maps with said basic reference field map, converting the basic reference field map into a distorted basic reference field map, or converting the distorted, dynamically obtained $B_0$ field maps into undistorted, dynamically obtained $B_0$ field maps.

4. A method as claimed in claim 3 comprising implementing said conversion from the group consisting of a bilinear interpolation, and a k-space-based conjugate phase technique.

5. A method as claimed in claim 1 comprising comparing the dynamically obtained $B_0$ field maps with said basic reference field map on a comparison basis selected from the group consisting of pixel-by-pixel, slice-by-slice, all pixels, and pixels differentiated according to body region or tissue relative to a standard deviation or an average or a difference.

6. A method as claimed in claim 1 comprising using, as said comparison criterion, a threshold value selected from the group consisting of a fixed threshold value and a dynamic threshold value, and correcting any incorrect $B_0$ field map that deviates from said threshold value by a predetermined amount, or replacing any incorrect $B_0$ field map that deviates from said threshold value by a predetermined amount with a replacement $B_0$ field map.

7. A method as claimed in claim 1 comprising correcting distorted, dynamically obtained $B_0$ field maps by subtracting a global offset relating to the basic reference field map or an offset relating to an updated reference field map obtained from the set of the distorted, dynamically obtained $B_0$ field maps.

8. A method as claimed in claim 6 comprising using, as said replacement field map, a field map selected from the group consisting of said basic reference field map, an updated reference field map obtained from said set of distorted, dynamically obtained $B_0$ field maps, and a combination of said set of distorted, dynamically obtained $B_0$ field maps and a weighted total of a portion of said set of distorted, dynamically obtained $B_0$ field maps.

9. A method as claimed in claim 1 comprising obtaining said $B_0$ field map used as said basic reference field map as one of said dynamically obtained $B_0$ field maps or a combination of dynamically obtained $B_0$ field maps, or a weighted total of dynamically obtained $B_0$ field maps.

10. A method as claimed in clam 1 comprising obtaining said $B_0$ field map that is used as said basic reference field map with a reduced spatial resolution and adjusting said reduced spatial resolution to a spatial resolution of said MR image data acquired from said subject using an interpolation method, and after said comparison, replacing said basic reference field map with one of said distorted, dynamically obtained $B_0$ field maps or a combination of said distorted, dynamically obtained $B_0$ field maps, or a weighted total of said distorted, dynamically obtained $B_0$ field maps.

11. A method as claimed in claim 1 comprising obtaining said $B_0$ field map that is used as said basic reference field map with a high spatial resolution and updating said basic reference field map using at least one of said distorted, dynamically obtained $B_0$ field maps obtained with a low resolution.

12. A method as claimed in claim 1 comprising correcting said MR image data acquired from said subject using a bilinear interpolation.

13. A method as claimed in clam 1 comprising obtaining said $B_0$ field map that is used as said basic reference field map by operating said MR scanner with a gradient echo method.

14. A method as claimed in claim 1 comprising acquiring said MR image data from said subject by operating said MR scanner with an echo planar imaging sequence.

15. A magnetic resonance (MR) apparatus comprising:

an MR scanner comprising a basic ($B_0$) field magnet that generates a $B_0$ field;

a control computer configured in a computer generating control signals and providing said control signals to operate said MR scanner in order to operate the MR scanner so as to obtain to obtain a $B_0$ field map as a basic reference field map;

said control computer being configured in said computer, generating further control signals and providing said further control signals from said computer to operate said MR scanner, after obtaining said basic reference field map, in order to operate the MR scanner so as to acquire MR data, during a predetermined MR data acquisition time, from a subject situated in the MR scanner, said MR data having distorted coordinates due to said $B_0$ field changing during said predetermined MR data acquisition time;

said control computer being configured to in said computer, using the acquired MR data to dynamically produce a set of distorted $B_0$ field maps during said MR data acquisition time;

a processor configured to compare said computer, during said predetermined MR data acquisition time each of the distorted, dynamically obtained $B_0$ field maps to said basic reference field map dependent on a comparison criterion, and identifying any distorted, dynamically obtained $B_0$ field map that does not satisfy said comparison criterion as an incorrect $B_0$ field map;

said processor being configured to correct each incorrect $B_0$ field map, to obtain a set of corrected distorted, dynamically obtained $B_0$ field maps;

as display screen; and said processor being configured to correct said MR data acquired from said subject using said set of corrected distorted, dynamically obtained $B_0$ field maps, and to use the corrected MR data from the subject to reconstruct image data that are free of artifacts to said distorted coordinates, and display said image data at a display screen as in MR image of the subject.

* * * * *